United States Patent
Vierheilig et al.

(10) Patent No.: US 10,333,278 B2
(45) Date of Patent: Jun. 25, 2019

(54) SEMICONDUCTOR LASER

(71) Applicant: OSRAM Opto Semiconductors GmbH, Regensburg (DE)

(72) Inventors: Clemens Vierheilig, Tegernheim (DE); Andreas Löffler, Neutraubling (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/752,442

(22) PCT Filed: Sep. 27, 2016

(86) PCT No.: PCT/EP2016/073003
§ 371 (c)(1),
(2) Date: Feb. 13, 2018

(87) PCT Pub. No.: WO2017/055287
PCT Pub. Date: Apr. 6, 2017

(65) Prior Publication Data
US 2019/0013649 A1   Jan. 10, 2019

(30) Foreign Application Priority Data
Sep. 28, 2015 (DE) .......... 10 2015 116 336

(51) Int. Cl.
*H01S 5/323* (2006.01)
*H01S 5/16* (2006.01)
(Continued)

(52) U.S. Cl.
CPC ............ *H01S 5/323* (2013.01); *H01S 5/0281* (2013.01); *H01S 5/1082* (2013.01); *H01S 5/16* (2013.01);
(Continued)

(58) Field of Classification Search
CPC ........ H01S 5/323; H01S 5/0281; H01S 5/221; H01S 5/1082; H01S 5/16; H01S 5/028;
(Continued)

(56) References Cited

U.S. PATENT DOCUMENTS 5,388,116 A * 2/1995 Ohkubo ............... H01S 5/16
                                            372/45.01
6,373,875 B1   4/2002 Yu et al.
(Continued)

FOREIGN PATENT DOCUMENTS

DE   10 2008 014 092 A1   7/2009
DE   10 2013 211 851 A1   12/2014
(Continued)

OTHER PUBLICATIONS

Shibutani, T. et al., "A Novel High-Power Laser Structure with Current-Blocked Regions Near Cavity Facets", *IEEE Journal of Quantum Electronics*, IEEE, Jun. 1987, vol. 23, No. 6, pp. 760-764.
(Continued)

*Primary Examiner* — Xinning(Tom) Niu
(74) *Attorney, Agent, or Firm* — DLA Piper LLP (US)

(57) ABSTRACT

A semiconductor laser includes a semiconductor layer sequence having an n-conducting n-region, a p-conducting p-region and an intermediate active zone, an electrically conductive p-contact layer that impresses current directly into the p-region and is made of a transparent conductive oxide, and an electrically conductive and metallic p-contact structure located directly on the p-contact layer, wherein the semiconductor layer sequence includes two facets forming resonator end faces for the laser radiation, in at least one current-protection region directly on at least one of the facets a current impression into the p-region is suppressed, the p-contact structure terminates flush with the associated facet so that the p-contact structure does not protrude
(Continued)

beyond the associated facet and vice versa, and the p-contact layer is removed from at least one of the current-protection regions and in this current-protection region the p-contact structure is in direct contact with the p-region over the whole area.

6 Claims, 3 Drawing Sheets

(51) Int. Cl.
  *H01S 5/028* (2006.01)
  *H01S 5/10* (2006.01)
  *H01S 5/22* (2006.01)
  H01S 5/042 (2006.01)

(52) U.S. Cl.
  CPC .............. *H01S 5/221* (2013.01); *H01S 5/028* (2013.01); *H01S 5/0425* (2013.01); *H01S 5/162* (2013.01); *H01S 5/166* (2013.01); *H01S 5/22* (2013.01)

(58) Field of Classification Search
  CPC .......... H01S 5/22; H01S 5/162; H01S 5/0425; H01S 5/166
  See application file for complete search history.

(56) References Cited

U.S. PATENT DOCUMENTS

| | | | |
|---|---|---|---|
| 2002/0159492 A1* | 10/2002 | Yamamura | H01S 5/162 372/46.01 |
| 2003/0091079 A1 | 5/2003 | Yokota | |
| 2004/0233950 A1 | 11/2004 | Furukawa et al. | |
| 2009/0278160 A1* | 11/2009 | Lin | H01L 33/025 257/99 |
| 2016/0141837 A1* | 5/2016 | Gomez-Iglesias | H01S 5/1014 372/45.01 |

FOREIGN PATENT DOCUMENTS

| | | |
|---|---|---|
| JP | H06-085384 A | 3/1994 |
| JP | 2002-261379 A | 9/2002 |
| JP | 2003-31894 A | 1/2003 |
| JP | 2005-142546 A | 6/2005 |
| JP | 2006-041491 A | 2/2006 |
| JP | 2006-108225 A | 4/2006 |
| JP | 2007-059672 A | 3/2007 |
| JP | 2009-117695 A | 5/2009 |

OTHER PUBLICATIONS

Notice of Reasons for Rejection dated Dec. 18, 2018, of counterpart Japanese Application No. 2018-504761, along with an English translation.

* cited by examiner

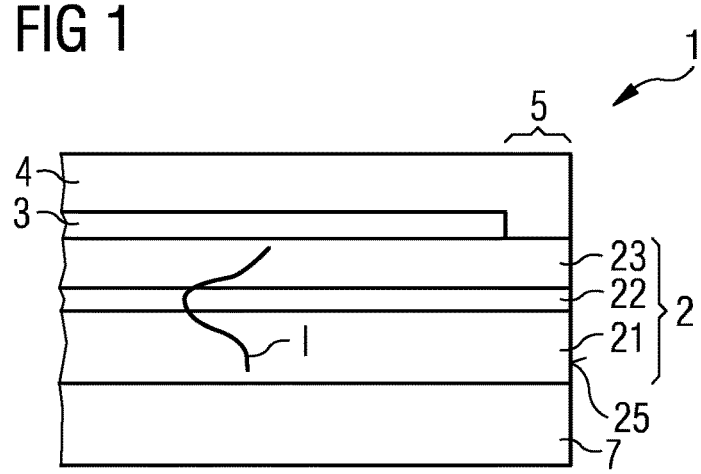
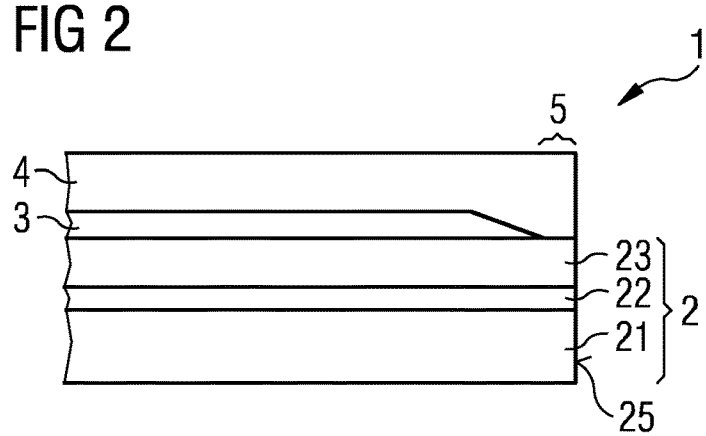
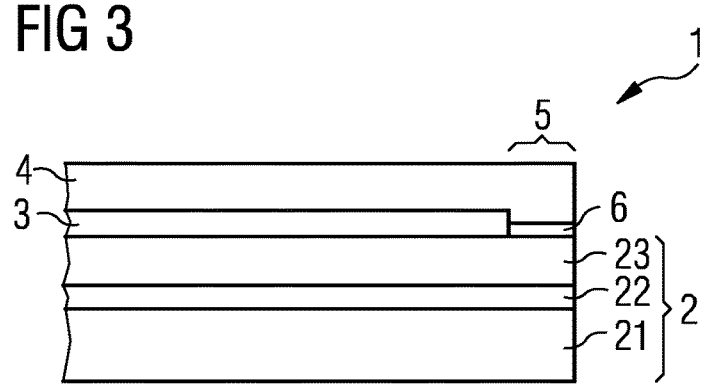

SEMICONDUCTOR LASER

TECHNICAL FIELD

This disclosure relates to a semiconductor laser.

BACKGROUND

There is a need to provide a semiconductor laser having a high output power that can be produced efficiently.

SUMMARY

We provide a semiconductor laser including a semiconductor layer sequence having an n-conducting n-region, a p-conducting p-region and an intermediate active zone that generates laser radiation, an electrically conductive p-contact layer that impresses current directly into the p-region and is made of a transparent conductive oxide, and an electrically conductive and metallic p-contact structure located directly on the p-contact layer, wherein the semiconductor layer sequence includes two facets forming resonator end faces for the laser radiation, in at least one current-protection region directly on at least one of the facets a current impression into the p-region is suppressed, the p-contact structure terminates flush with the associated facet so that the p-contact structure does not protrude beyond the associated facet and vice versa, and the p-contact layer is removed from at least one of the current-protection regions and in this current-protection region the p-contact structure is in direct contact with the p-region over the whole area.

We also provide a semiconductor laser including a semiconductor layer sequence having an n-conducting n-region, a p-conducting p-region and an intermediate active zone that generates laser radiation, an electrically conductive p-contact layer that impresses current directly into the p-region, and an electrically conductive and metallic p-contact structure located directly on the p-contact layer, wherein the semiconductor layer sequence includes two facets forming resonator end faces for the laser radiation, in at least one current-protection region directly on at least one of the facets a current impression into the p-region is suppressed, the p-contact structure terminates flush with the associated facet so that the p-contact structure does not protrude beyond the associated facet and vice versa, and the p-contact layer is removed from at least one of the current-protection regions and in this current-protection region the p-contact structure is in direct contact with the p-region over the whole area.

BRIEF DESCRIPTION OF THE DRAWINGS

FIGS. 1 to 7 show schematic sectional representations of examples of semiconductor lasers described here.

Figure 4:
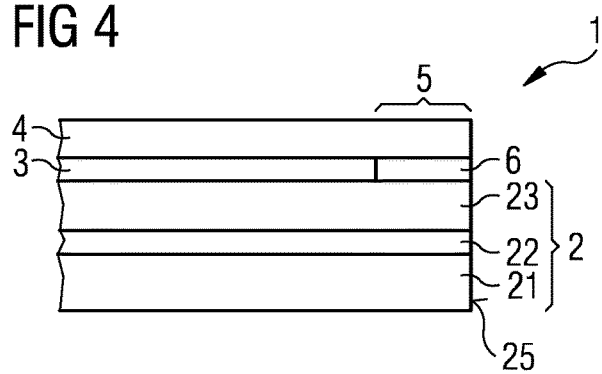

LIST OF REFERENCE SIGNS 1 semiconductor laser
2 semiconductor layer sequence
21 n-region
22 active zone
23 p-region
25 facet
3 p-contact layer
4 metallic p-contact structure
5 current-protection region
6 insulator layer
61 modification of the p-region
7 substrate for the semiconductor layer sequence
8 insulating layer
9 ridge waveguide
I intensity of the laser radiation

DETAILED DESCRIPTION

Our semiconductor laser comprises a semiconductor layer sequence. The semiconductor layer sequence comprises an n-conducting n-region. The semiconductor layer sequence likewise has a p-conducting p-region. An active zone is located between the n-region and the p-region. The active zone is designed to generate laser radiation on the basis of electroluminescence. In other words, the n-region, the active zone and the p-region follow one another, along or counter to a growth direction of the semiconductor layer sequence, preferably adjoining each other directly one on top of the other.

The semiconductor layer sequence is preferably based on a III-V compound semiconductor material. The semiconductor material is, for example, a nitride-compound semiconductor material such as $Al_nIn_{1-n-m}Ga_mN$ or a phosphide-compound semiconductor material such as $Al_nIn_{1-n-m}Ga_nP$ or also an arsenide-compound semiconductor material such as $Al_nIn_{1-n-m}Ga_mAs$, wherein $0 \leq n \leq 1$, $0 \leq m \leq 1$ and $n+m \leq 1$. In this case, the semiconductor layer sequence can have dopants and additional constituents. For the sake of simplicity, however, only the essential components of the crystal lattice of the semiconductor layer sequence are indicated, that is As, Ga, In, N or P, even if they can be partially replaced and/or supplemented by small quantities of other substances.

The laser radiation may have a wavelength of maximum intensity lying in the near ultraviolet spectral range. Near ultraviolet spectral range, in particular, designates wavelengths of 200 nm to 420 nm or 320 nm to 420 nm. Alternatively, the semiconductor laser emits visible laser radiation, for example, blue laser radiation or red laser radiation. Blue light preferably relates to a dominant wavelength of at least 420 nm and/or of at most 490 nm. Red light refers, in particular, to dominant wavelengths of 600 nm to 700 nm. Furthermore, it is possible for the laser radiation to be near-infrared radiation, that is to say radiation having a wavelength of maximum intensity, for example, of 700 nm to 1600 nm. Laser radiation in the green or yellow spectral range of 490 nm to 600 nm can also be generated.

The semiconductor laser may have a p-contact layer. The p-contact layer is preferably located directly on the p-region. Furthermore, the p-contact layer is provided directly in the p-region for impressing current.

The p-contact layer is preferably made of a metal or a material from the class of the transparent conductive oxides, TCOs for short, for example, made of ZnO or ITO.

The semiconductor laser may comprise a p-contact structure. The p-contact structure is preferably located directly on the p-contact layer. The p-contact layer is supplied with current via the p-contact structure. The p-contact structure is thus electrically conductive.

The p-contact structure may be formed from a metal or from a metal alloy. The p-contact structure can be composed of a plurality of partial layers. Preferably, the p-contact structure comprises one or more of the following metals or consists of one or more of these metals, mixed or divided into partial layers: Au, Ag, Ni, Sn, Pd, Pt, Rh, Ti. The p-contact layer can be formed from the same metals.

The semiconductor layer sequence may have two or more than two facets. The facets preferably form end faces for a resonator in which the laser radiation is generated and guided. In particular, one of the facets is coated in a highly reflective manner so that a reflectivity of this facet for the laser radiation is preferably at least 90% or 95% or 99% or 99.8%. A further facet is preferably designed to couple out the laser radiation from the semiconductor laser. This facet has, for example, a comparatively low reflectivity for the laser radiation of at most 50% or 70% or 85%. In other words, the two facets, which are preferably located at mutually opposite ends of the semiconductor layer sequence, form two resonator end faces for the laser radiation, between which a resonator runs.

The p-contact structure may terminate flush with the facet on which the associated current-protection region is located. This preferably applies with a tolerance of at most 5 µm or 2 µm or 0.5 µm. This means that the contact structure then does not project beyond the associated facet or vice versa.

The semiconductor laser may have a current-protection region. The current-protection region is located directly on at least one of the facets. A current-protection region is preferably present at each of the facets on which the laser radiation passes. In the at least one current-protection region, an impression of current into the p-region is suppressed. For example, a current impression in the current-protection region is reduced by at least a factor of 10 or 100 or 500 in comparison to other regions of the p-region. Since the p-region preferably has only a low electrical conductivity in the direction parallel to the active zone, it is thus possible to prevent the active zone from being supplied with current directly at the facets.

The current-protection region may have an extent of greater than 0 in the direction perpendicular to the associated facet. In particular, this extent is at least 0.5 µm or 5 µm or 10 µm. Alternatively or additionally, the extent of the current-protection region is at most 100 µm or 30 µm or 20 µm. Furthermore, it is possible for an extent of the current-protection region to be at most 20% or 10% or 5% or 2% of a length of the resonator for the laser radiation.

The semiconductor laser may comprise a semiconductor layer sequence. The semiconductor layer sequence comprises an n-conducting n-region, a p-conducting p-region and an intermediate active zone that generates laser radiation. To impress current, an electrically conductive p-contact layer is located directly on the p-region. An electrically conductive and metallic p-contact structure is attached directly to the p-contact layer. Two facets of the semiconductor layer sequence form resonator end faces for the laser radiation. In at least one current-protection region directly on at least one of the facets, a current impression into the p-region is suppressed. The p-contact structure terminates flush with the associated facet.

In the comparatively strongly growing markets of laser-based applications, for example, for projection, illumination or material processing, conventional laser diodes are limited in terms of their maximum output power, efficiency and service life. In the semiconductor laser described here, owing to the current-protection region, a spontaneous failure rate on account of optical damage to the facets, also referred to as catastrophic optical damage or COD for short, is reduced.

In addition, despite the current-protection region, standardized separation processes of the semiconductor layer sequence such as grown on a wafer can be used. This is possible in particular by virtue of the fact that the p-contact structure is applied over the whole area and contiguously to the semiconductor layer sequence and can remain as a contiguous metal layer until singulation. Changes in a strain of the semiconductor layer sequence, compared to a conventional singulation process, can thereby be avoided.

The p-contact layer and the p-contact structure, in the direction parallel to the active zone, may terminate flush with at least one or, preferably, with all facets and/or resonator end surfaces.

The laser radiation does not have to reach or significantly reach the p-contact layer during operation of the semiconductor laser. In other words, the p-region is sufficiently thick to shield the laser radiation from the p-contact layer. Alternatively, it is possible for the p-contact layer to be transparent to the laser radiation and represent part of a system for wave guidance in the semiconductor laser.

The p-contact layer may be removed from at least one or removed from all current-protection regions, in particular completely removed. Since electric current is preferably impressed into the p-region only via the p-contact layer, the current-protection region is thus excluded from a current supply.

The p-contact structure in the current-protection region may be in direct contact with the p-region. In particular, the p-contact structure in the current-protection region is applied over the whole area to the p-region.

An electrical insulator layer may be located on the p-region in at least one current-protection region, preferably directly on the p-region. The insulator layer is electrically insulating or also electrically poorly conductive so that the conductivity of the insulator layer is then lower by at least a factor of 10 or 100 or 1000 than a conductivity of the p-contact layer. The insulator layer is formed, for example, from a ceramic material, a glass, a dielectric, a nitride and/or an oxide. For example, the insulator layer consists of or comprises one or more of the following materials: $Al_2O_3$, $SiO_2$, $TiO_2$, $Ta_2O_5$, $HfO_2$, $Si_3N_4$, AlN, SiC, diamond-like carbon, DLC for short. The insulator layer is preferably produced by atomic layer deposition, ALD for short. Alternatively, it is possible for the insulator layer to be produced by sputtering, chemical vapor deposition or thermal evaporation.

The insulator layer may have a constant thickness in the entire current-protection region. In other words, no specific thickness variation of the insulator layer is set.

The thickness of the insulator layer may be at most 75% or 50% or 20% or 5% of the thickness of the p-contact layer. Alternatively or additionally, the thickness of the insulator layer is at least 20 nm or 50 nm or 100 nm and/or at most 1 µm or 500 nm or 100 nm. It is alternatively also possible that the insulator layer is of the same thickness as, or also thicker than the p-contact layer.

The insulator layer may directly adjoin the p-region on a main side and directly adjoin the p-contact structure on an opposite main side. Both main sides are preferably completely covered by a material of the p-region and the p-contact structure. In other words, the insulator layer is then located directly and completely between the p-contact structure and the p-region. In the lateral direction, that is to say in the direction parallel to the active zone, the insulator layer can directly adjoin the p-contact layer.

The insulator layer may partially or completely cover the associated facet. In particular, a region of the active zone at the facet is covered by the insulator layer.

The insulator layer may be composed of multiple layers. Thus, the insulator layer can be a layer stack, by which a reflectivity of the associated facet is set. For example, the insulator layer is designed as an antireflection layer or as a highly reflective mirror. The insulator layer can have a sequence of layers with alternately high and low refractive indices for the laser radiation.

The insulator layer may be formed from a material with good thermal conductivity. This ensures a thermal connection of a region close to the associated facet to the preferably thermally highly conductive p-contact structure. Materials for the insulator layer are then in particular diamond-like carbon, SiC or AlN. In this case, a specific thermal conductivity of the material for the insulator layer is preferably at least 10 W/m·K or 50 W/m·K or 100 W/m·K.

The p-region may be modified in at least one current-protection region. As a result of the modification, current injection into the p-region is prevented or greatly reduced in this current-protection region. For example, a roughening is produced in the current-protection region at the p-region or a crystal quality and/or a p-conductivity of the semiconductor layer sequence is reduced. This can be achieved, for example, by back-sputtering, etching or by plasma damage to the semiconductor layer sequence. In other words, the modification increases a contact resistance between the p-contact layer and the p-region and/or between the p-contact structure and the p-region.

The p-contact layer may be directly modified at the p-region in at least one current-protection region. By modifying the p-contact layer, current injection into the p-region is reduced in this current-protection region. For example, in a transparent conductive oxide being used for the p-contact layer, a contact resistance and/or a current conductivity towards the p-region can be set by an adapted temperature treatment in combination with a selective covering. The modified region can adjoin the p-contact structure and/or the p-contact layer over the whole area and directly.

The p-contact layer may be only partially removed in the at least one current-protection region. In this current-protection region, the p-contact layer is then preferably not replaced by other components of the semiconductor laser. For example, a recess or a cavity is formed at the location of the p-contact layer on the current-protection region.

The p-contact layer may be partially removed in the current-protection region. The region of the p-contact layer having been removed can be filled with a further material. The further material preferably has a low optical refractive index for the laser radiation and is preferably electrically insulating. The further material can be of the same material as the insulator layer. In this respect, reference is made to the statements relating to the insulator layer with regard to the further material.

The p-contact layer may be only partially removed in at least one current-protection region and has a decreasing thickness in the direction towards the associated facet. The thickness preferably decreases monotonically or strictly monotonically in the direction towards the facet. The reduction in thickness can be carried out linearly or with a curvature.

The p-contact layer may be completely removed directly at the associated facet. This region in which the p-contact layer is completely removed preferably has an extent in the direction perpendicular to this facet of at least 0.5 µm or 2 µm or 5 µm and alternatively or additionally of at most 70% or 50% or 20% of the extent of the associated current-protection region, that is to say of the region from which the p-contact layer is at least partially removed.

The p-contact layer may be present in the current-protection region. In this case, the p-contact layer preferably extends completely over the entire current-protection region in a constant thickness. In particular, it is possible for the p-contact layer to terminate flush with the associated facet and/or to terminate flush with the p-contact structure, in the direction parallel to the active zone.

A material of the p-contact structure may have a higher contact resistance in the p-region than a material of the p-contact layer. At a boundary of the current-protection region facing away from the associated facet, the p-contact layer and the p-contact structure preferably touch each other over the whole area.

The p-contact layer may be spaced apart from the p-contact structure in the direction parallel to the active zone. In the direction parallel to the active zone, a cavity can then be formed between the p-contact layer and the p-contact structure.

The semiconductor laser may be a strip laser. The strip laser has a ridge waveguide. A guiding of the laser radiation in the resonator between the facets is made possible via the ridge waveguide. In particular, the ridge waveguide is formed by an elevation of the p-region via remaining regions of the p-region. A width of the ridge waveguide in the direction perpendicular to the resonator for the laser radiation is, for example, at least 1 µm or 5 µm and/or at most 50 µm or 15 µm.

Our semiconductor laser described here is explained in more detail below with reference to the drawings on the basis of examples. Identical reference signs indicate the same elements in the individual figures. In this case, however, no relationships to scale are illustrated. Rather, individual elements can be represented with an exaggerated size to afford a better understanding.

FIG. 1 shows an example of a semiconductor laser 1. A semiconductor layer sequence 2 is situated on a substrate 7. The semiconductor layer sequence 2 has an n-conducting n-region 21, an active zone 22 and a p-conducting p-region 23. The n-region 21, the active zone 22 and the p-region 23 follow one another directly in the direction away from the substrate 7.

A current impression into the semiconductor layer sequence 2 takes place, on the one hand, from the direction of the substrate 7 and/or from the n-region 21 and, on the other hand, from a p-contact layer 3 and a p-contact structure 4. The p-contact structure 4 is formed from at least one metal. In particular, the semiconductor laser 1 can be electrically contacted externally via the p-contact structure 4, for example, by soldering or via a bonding wire. The p-contact layer 3 is a metal layer or a layer made of a transparent conductive oxide, in particular of ITO, $In_2O_3$, $SnO_2$ or ZnO or combinations thereof. The p-contact structure 4 is, for example, thicker by at least a factor of 5 than the p-contact layer 3.

A laser radiation generated in the active zone 22 is guided in the semiconductor layer sequence 2, wherein the p-region 23 and the n-region 21 each form cladding layers. In particular, the p-region 23 is selected to be thick so that no or only a negligible amount of the laser radiation passes to the p-contact layer 3. An intensity I of the laser radiation is schematically indicated in FIG. 1.

In the direction parallel to the active zone 22, the semiconductor layer sequence 2 is delimited by a facet 25. A reflection or a coupling-out of the generated laser radiation takes place at the facet 25. Accordingly, a highly reflective or anti-reflective layer is preferably applied to the facet 25, not shown. In all examples, a passivation layer (not shown) is furthermore preferably located on the semiconductor layer sequence 2.

A current-protection region 5 is located close to the facet 25. The p-contact layer 3 is removed from the current-protection region 5. In the current-protection region 5, the p-region 23 is completely covered with the p-contact structure 4. In the direction parallel to the active zone 22, the p-contact structure 4 and the p-contact layer 3 adjoin one another directly and over the whole area.

Since a material of the p-contact structure 4 has a significantly greater contact resistance to the p-region 23 than a material of the p-contact layer 3, no current or only a very small current is impressed into the p-region 23 in the current-protection region 5. In the direction away from the facet 25, the current-protection region 5 preferably has an extent of 5 µm to 40 µm or of 10 µm to 20 µm. Since no current is impressed directly at the facet 25, and since the p-region 23 has only a small lateral current conductivity, no charge carrier recombination or only a negligible charge carrier recombination takes place directly at the facet 25. As a result, a COD at the facet 25 can be avoided and the semiconductor laser 1 can be operated at higher currents than a corresponding laser without such current-protection region 5.

In the other examples, a profile of the intensity I and the substrate 7 are not drawn in each case. However, in this regard, the same as explained in conjunction with FIG. 1 applies in the remaining examples, unless indicated otherwise.

In the example of FIG. 2, the p-contact layer 3 becomes continuously thinner towards the facet 25. A region of the p-region 23 directly at the facet 25 is free of the p-contact layer 3. Unlike in FIG. 2, a thickness of the p-contact layer 3 can decrease not only linearly but also with a curved profile. As a result of this design of the p-contact layer 3 close to the current-protection region 5, the p-contact layer 3 is better mantled when the p-contact structure 4 is produced.

In the example of FIG. 3, too, the p-contact layer 3 is completely removed from the current-protection region 5. In the current-protection region 5, an insulator layer 6 is applied to the p-region 23. The insulator layer 6 is formed from an electrically insulating and preferably thermally conductive material, for example, aluminum oxide. The insulator layer 6 is preferably produced by atomic layer deposition. The thickness of the insulator layer 6 is preferably smaller than a thickness of the p-contact layer 3.

In the example of FIG. 4, the insulator layer 6 has the same thickness as the p-contact layer 3. Alternatively, the insulator layer 6 can also be thicker than the p-contact layer 3.

Figure 5:
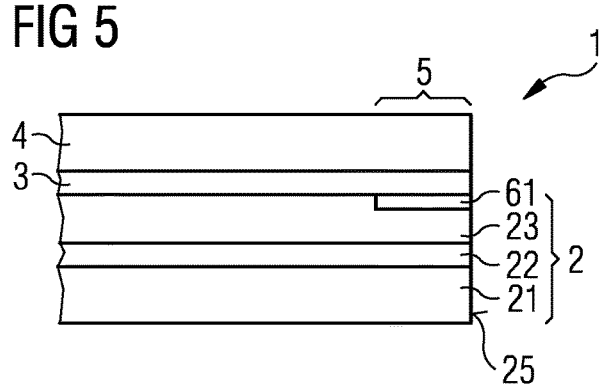
Figure 6:
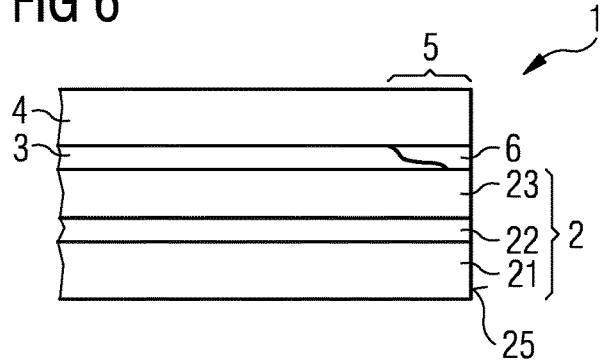

In the example as shown in FIG. 5, the current-protection region 5 is formed by a local modification 61 of the p-region 23. A contact resistance between the semiconductor layer sequence 2 and the p-contact layer 3 is locally increased, for example, by back-sputtering, etching or plasma damage of the p-region 23 so that no current or substantially no current is impressed into the semiconductor layer sequence 2 in the current-protection region 5.

According to FIG. 5, both the p-contact layer 3 and the p-contact structure 4 terminate flush with the facet 25 on the semiconductor layer sequence 2. The same can also be the case in the example of FIG. 3.

Figure 7:
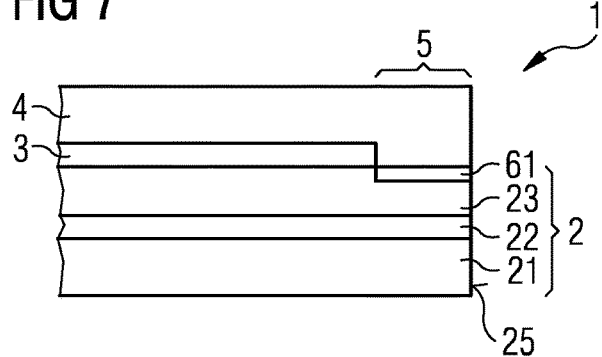

Furthermore, as an alternative to the representation of FIG. 5, it is possible that the modification 61 is arranged next to the p-contact layer 3 when viewed in a plan view. Thus, see FIG. 7, the modification 61 and the p-contact layer 3 then terminate flush against one another and do not overlap each other. In contrast to the illustration in FIG. 7, the modification 61 can also extend to below the p-contact layer 3. In this case, the p-contact layer 3 then projects into the current-protection region 5. As an alternative to the representation of FIG. 7, the modification 61 can also be arranged separately from the p-contact layer 3 so that in plan view a gap is formed between the modification 61 and the p-contact layer 3.

Figure 8:
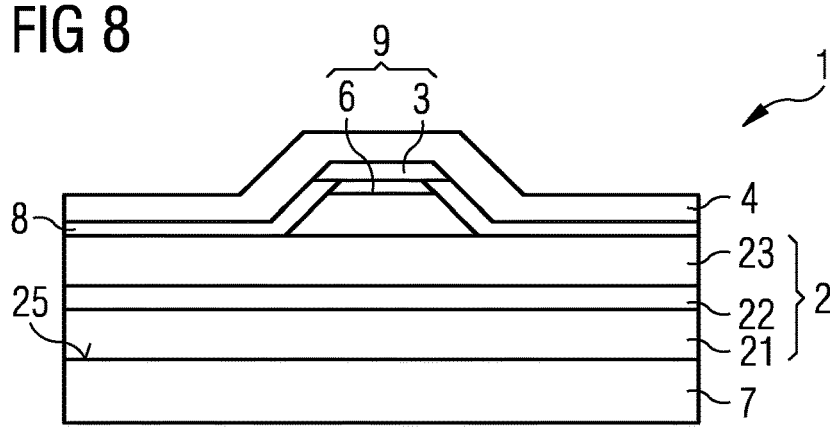
FIG. 8 shows a schematic sectional illustration of an example of a semiconductor laser described here.

FIG. 8 shows that, in addition, a ridge waveguide 9 protrudes in the p-region 23, as is also possible in all other examples. An approximately one-dimensional guidance of the laser radiation in the semiconductor layer sequence 2 in the direction perpendicular to the facets 25 is made possible via the ridge waveguide 9. The current-protection region in the semiconductor laser 1 of FIG. 8 is designed, for example, as explained in conjunction with FIG. 3.

The p-region 23 is covered with an electrical insulating layer 8 outside the ridge waveguide. At least the p-contact structure 4 is mounted laterally alongside the ridge waveguide 9 on the insulating layer 8. Unlike in FIG. 8, the p-contact layer 3 can be located next to the ridge waveguide 9 between the p-contact structure 4 and the insulating layer 8.

In all the examples, it is possible for the insulator layer 6, the p-contact layer 3 and/or the p-contact structure 4 to be composed of a plurality of partial layers, wherein these partial layers preferably directly follow one another. Furthermore, the examples can be combined with one another. For example, in connection with FIG. 2 isolator layers 6 or modifications 61 as shown, for example, in FIG. 3 to 5 or 7 can be present. It is likewise possible in all examples that the facet 25 is partially or completely covered by the insulator layer 6 or else by a non-illustrated passivation.

The semiconductor lasers 1 each have in particular two mutually opposite facets 25 oriented parallel to one another. The facets 25 are particularly preferably each provided with a current-protection region 5, wherein both facets can be provided with a similar current-protection region 5, or wherein different current-protection regions 5, as illustrated in conjunction with FIGS. 1 to 7, can be combined with one another in a single semiconductor laser 1.

Figure 9:
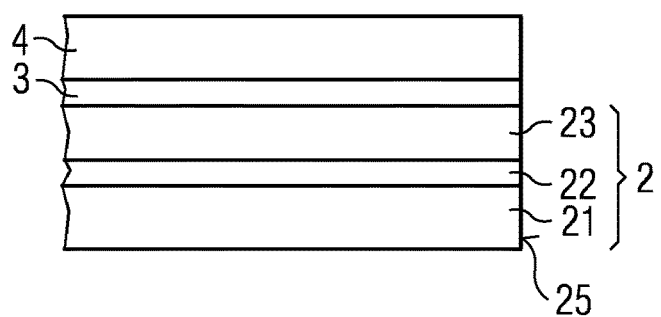
FIGS. 9 and 10 show schematic sectional representations of modifications of semiconductor lasers.

FIG. 9 shows a modification of the semiconductor laser. In this semiconductor laser, both the p-contact layer 3 and the p-contact structure 4 reach up to the facet 25. As a result, a current injection into the semiconductor layer sequence 2 also takes place directly at the facet 25. On account of charge carrier recombination, which takes place directly at the facet 25 as a result, a risk of damage due to heating of semiconductor material directly at the facet 25 is increased. Therefore, the semiconductor laser of FIG. 9 can be operated only with lower currents to avoid such damage.

Figure 10:
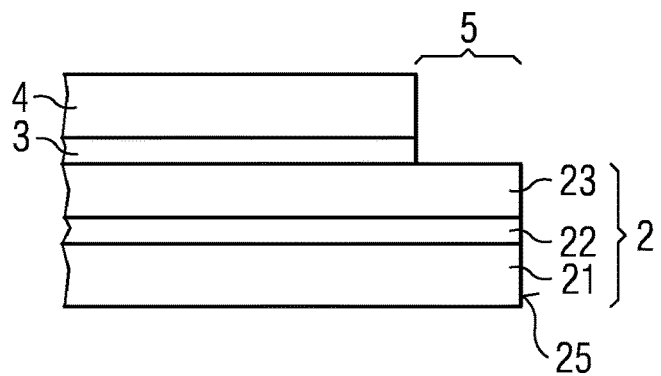

In the modification of FIG. 10, both the p-contact layer 3 and the p-contact structure 4 are removed from the current-protection region 5. As a result, however, the semiconductor layer sequence 2 cannot be produced from a wafer using a standard process. In particular, mechanical stresses are caused by omission of the p-contact structure 4 relative to a continuous p-contact structure 4 as illustrated in conjunction with the examples of FIGS. 1 to 8. Compared to the modification of FIG. 10, production of the semiconductor lasers 1 in accordance with the illustrated examples is thus simplified.

Our semiconductor lasers described here are not restricted by the description on the basis of the examples. Rather, this disclosure encompasses any new feature and also any combination of features, which includes in particular any combination of features in the appended claims, even if the feature or combination itself is not explicitly specified in the claims or examples.

This application claims priority of DE 10 2015 116 336.5, the subject matter of which is incorporated herein by reference.

The invention claimed is:

1. A semiconductor laser comprising:
   a semiconductor layer sequence having an n-conducting n-region, a p-conducting p-region and an intermediate active zone that generates laser radiation,
   an electrically conductive p-contact layer that impresses current directly into the p-region and is made of a transparent conductive oxide, and
   an electrically conductive and metallic p-contact structure located directly on the p-contact layer,
   wherein
   the semiconductor layer sequence comprises two facets forming resonator end faces for the laser radiation,
   in at least one current-protection region directly on at least one of the facets a current impression into the p-region is suppressed,
   the p-contact structure terminates flush with the associated facet so that the p-contact structure does not protrude beyond the associated facet and vice versa, and
   the p-contact layer is removed from at least one of the current-protection regions and in this current-protection region the p-contact structure is in direct contact with the p-region,
   in said at least one current-protection region, the p-contact layer becomes continuously thinner towards the associated facet.

2. The semiconductor laser according to claim 1, wherein the p-contact layer is only partially removed in at least one current-protection region, and
   a thickness of the p-contact layer decreases in a direction towards the facet and the p-contact layer is completely removed directly at the associated facet.

3. The semiconductor laser according to claim 1, wherein, in the direction perpendicular to the associated facet, the current-protection region has an extent of at least 0.5 µM and at most 100 µm and additionally at most 20% of a resonator length for the laser radiation.

4. The semiconductor laser according to claim 1, which is a strip laser with a ridge waveguide.

5. A semiconductor laser comprising:
   a semiconductor layer sequence having an n-conducting n-region, a p-conducting p-region and an intermediate active zone that generates laser radiation,
   an electrically conductive p-contact layer that impresses current directly into the p-region, and
   an electrically conductive and metallic p-contact structure located directly on the p-contact layer,
   wherein
   the semiconductor layer sequence comprises two facets forming resonator end faces for the laser radiation,
   in at least one current-protection region directly on at least one of the facets a current impression into the p-region is suppressed,
   the p-contact structure terminates flush with the associated facet so that the p-contact structure does not protrude beyond the associated facet and vice versa, and
   the p-contact layer is removed from at least one of the current-protection regions and in this current-protection region the p-contact structure is in direct contact with the p-region,
   in said at least one current-protection region, the p-contact layer becomes continuously thinner towards the associated facet,
   the semiconductor layer sequence extends unaffected from the current-protection region until the facet provided with the current-protection region so that the active zone, the p-conducting p-region and the n-conducting n-region extend with a constant thickness over the whole semiconductor layer sequence until said facet, and
   the p-contact structure is in direct contact with the p-contact layer and the p-conducting p-region, respectively, until the facet.

6. The semiconductor laser according to claim 5, wherein the region in which the p-contact layer is completely removed has an extent in the direction perpendicular to this facet of at least 2 µm and of at most 50% of the extent of the associated current-protection region.

* * * * *